(12) United States Patent
Moosburger et al.

(10) Patent No.: US 8,598,705 B2
(45) Date of Patent: Dec. 3, 2013

(54) COMPOSITE SUBSTRATE FOR A SEMICONDUCTOR CHIP

(75) Inventors: Jürgen Moosburger, Regensburg (DE); Peter Stauβ, Pettendorf (DE); Andreas Plöβl, Regensburg (DE)

(73) Assignee: OSRAM Opto Semiconductors GmbH (DE)

( * ) Notice: Subject to any disclaimer, the term of this patent is extended or adjusted under 35 U.S.C. 154(b) by 22 days.

(21) Appl. No.: 13/128,960

(22) PCT Filed: Nov. 9, 2009

(86) PCT No.: PCT/DE2009/001500
§ 371 (c)(1),
(2), (4) Date: Jun. 13, 2011

(87) PCT Pub. No.: WO2010/054618
PCT Pub. Date: May 20, 2010

(65) Prior Publication Data
US 2011/0233784 A1    Sep. 29, 2011

(30) Foreign Application Priority Data

Nov. 14, 2008 (DE) .......................... 10 2008 057 348
Feb. 5, 2009 (DE) .......................... 10 2009 007 625

(51) Int. Cl.
*H01L 23/48*    (2006.01)

(52) U.S. Cl.
USPC ........... 257/750; 257/741; 257/754; 257/769; 257/770; 257/E23.164

(58) Field of Classification Search
USPC ........... 257/750, 754, 761, 763, 766, 80, 741, 257/747, 748, 769, 770, 773, 784, E21.119, 257/E33.001, E23.16, E23.164
See application file for complete search history.

(56) References Cited

U.S. PATENT DOCUMENTS

| | | | |
|---|---|---|---|
| 3,766,634 A | 10/1973 | Babcock et al. | |
| 4,845,044 A * | 7/1989 | Ariyoshi et al. | 438/480 |
| 6,045,626 A | 4/2000 | Yano et al. | |
| 7,011,706 B2 * | 3/2006 | Higuchi et al. | 117/89 |
| 8,158,995 B2 * | 4/2012 | Ploessl et al. | 257/98 |
| 2002/0074670 A1 | 6/2002 | Suga | |
| 2003/0232466 A1 | 12/2003 | Zistl et al. | |
| 2004/0033638 A1 | 2/2004 | Bader et al. | |
| 2004/0209440 A1 | 10/2004 | Peterson | |
| 2006/0240644 A1 | 10/2006 | Le Vaillant | |
| 2011/0094668 A1 | 4/2011 | Le Vaillant | |

FOREIGN PATENT DOCUMENTS

| | | | |
|---|---|---|---|
| CN | 1902747 | 1/2007 | |
| DE | 297 734 A5 | 1/1992 | |
| DE | 100 18 358 A1 | 10/2000 | |
| DE | 10 2008 030 346 A1 | 12/2009 | |
| JP | 1-189909 * | 7/1989 | H01L 21/20 |
| WO | 2009/066949 A2 | 5/2009 | |

* cited by examiner

*Primary Examiner* — Jasmine Clark
(74) *Attorney, Agent, or Firm* — DLA Piper LLP (US)

(57) ABSTRACT

A composite substrate for a semiconductor chip includes a first covering layer containing a semiconductor material, a second covering layer, and a core layer arranged between the first covering layer and the second covering layer, wherein the core layer has a greater coefficient of thermal expansion than the covering layers.

18 Claims, 6 Drawing Sheets

COMPOSITE SUBSTRATE FOR A SEMICONDUCTOR CHIP

RELATED APPLICATIONS

This is a §371 of International Application No. PCT/DE2009/001500, with an international filing date of Nov. 9, 2009 (WO 2010/054618, published May 20, 2010), which is based on German Patent Application Nos. 10 2008 057 348.5, filed Nov. 14, 2008, and 10 2009 007 625.5, filed Feb. 5, 2009, the subject matter of which is incorporated by reference.

TECHNICAL FIELD

This disclosure relates to a composite substrate suitable as a growth or carrier substrate for the application of a semiconductor layer sequence of a semiconductor chip.

BACKGROUND

For the growth of gallium nitride-based semiconductor layer sequences, it is possible, for example, to use a silicon substrate, as a growth substrate. In that case, the different coefficients of thermal expansion of silicon ($2.6*10^{-6}$/K at room temperature) and GaN ($4.2*10^{-6}$/K at room temperature) during and after growth can lead to flexure of the semiconductor layer sequence and the growth substrate. The consequences are an inhomogeneous crystal quality of the semiconductor layer sequence and an increased risk of cracking in the semiconductor layer sequence. The same problem can occur during the rebonding of the semiconductor layer sequence onto a replacement substrate composed of silicon.

Measures for avoiding these problems extend to the use of buffer structures which, at growth temperature, enable a compressively strained growth of the semiconductor layer sequence, such that, upon cooling to room temperature, as a result of the different coefficients of thermal expansion, the compressive strain can be compensated for and only a low tensile strain of the semiconductor layer sequence is established. The buffer structure can be formed from a layer sequence of AlN/AlGaN/GaN, for example. However, disadvantages of a semiconductor layer sequence with a buffer structure of this type are, inter alia, the reduced vertical and lateral current conductivity in the completed semiconductor chip.

Therefore, it could be helpful to provide a composite substrate which enables a semiconductor chip having improved electrical properties. Furthermore, it could be helpful to provide an optoelectronic semiconductor chip having improved electrical properties.

SUMMARY

We provide a composite substrate for a semiconductor chip including a first covering layer containing a semiconductor material, a second covering layer, and a core layer arranged between the first covering layer and the second covering layer, wherein the core layer has a greater coefficient of thermal expansion than the covering layers.

We also provide a composite substrate for a semiconductor chip including a first covering layer containing a semiconductor material, a second covering layer, and a core layer arranged between the first covering layer and the second covering layer, wherein the core layer has a lower coefficient of thermal expansion than the covering layers.

We further provide an optoelectronic semiconductor chip including the composite substrate, and a semiconductor layer sequence arranged on the first covering layer and having a greater coefficient of thermal expansion than the first covering layer.

We still further provide an optoelectronic semiconductor chip including the composite substrate, and a semiconductor layer sequence arranged on the first covering layer and having a lower coefficient of thermal expansion than the first covering layer.

DETAILED DESCRIPTION

Figure 1:
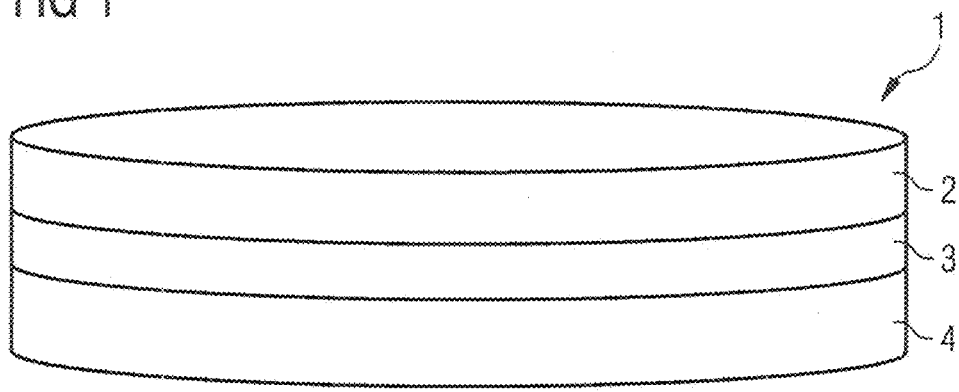
FIG. 1 shows a perspective illustration of a composite substrate.

Preferably, the composite substrate comprises a first covering layer, which contains a semiconductor material, a second covering layer and a core layer arranged between the first covering layer and the second covering layer, wherein the core layer has a greater coefficient of thermal expansion than the covering layers.

The layers of the composite substrate are advantageously connected to one another in substance-to-substance bonds and in a positively locking manner. Fundamentally, in the case of a composite substrate comprising a core layer having a different coefficient of thermal expansion than the covering layers, in total it is possible to obtain a coefficient of thermal expansion which is better adapted to the coefficient of thermal expansion of a semiconductor layer sequence than a substrate composed of the material of the first covering layer.

If the semiconductor layer sequence has a greater coefficient of thermal expansion than a conventionally used growth substrate of carrier substrate, then it is advantageous to provide the substrate with a core layer having a greater coefficient of thermal expansion than the conventional growth substrate or carrier substrate to thus obtain a composite substrate which is better adapted to the coefficient of thermal expansion of the semiconductor layer sequence than the conventional growth substrate or carrier substrate.

However, it is also conceivable for the semiconductor layer sequence to have a lower coefficient of thermal expansion than a conventionally used growth substrate or carrier substrate. In this case, the growth substrate or carrier substrate is advantageously provided with a core layer having a lower coefficient of thermal expansion than the conventional growth substrate or carrier substrate to likewise obtain a composite substrate which is better adapted to the coefficient of thermal expansion of the semiconductor layer sequence than the conventional growth substrate or carrier substrate.

Preferably, the covering layers and the core layer are held together by a eutectic compounds. The eutectic compound advantageously has a stable thermal behavior of the composite substrate, such that damage to the composite substrate need not be feared either during growth or rebonding of the semiconductor layer sequence or during cooling to room temperature.

In particular, the eutectic compound has a eutectic temperature which is greater than the temperatures occurring during the growth or rebonding of the semiconductor layer sequence. Preferably, the eutectic compound has a eutectic temperature which is greater than 1100° C. This is advantageous in particular with regard to the growth temperatures prevailing during the growth of the semiconductor layers sequence, which growth temperatures can be up to 1200° C.

Preferably, the first covering layer, which contains a semiconductor material, is a growth layer for the growth of the semiconductor layer sequence of the semiconductor chip. Consequently, the necessary long-range order in the semiconductor layer sequence can be reported by the first covering layer. Advantageously, the expansion behavior is not automatically defined by the choice of a first covering layer suitable for the growth of the semiconductor layer sequence. Rather, the expansion behavior of the composite substrate can be improved by a suitable choice of the core layer.

A material suitable for the first covering layer is, in particular, silicon. A GaN-based semiconductor layer sequence can advantageously be grown onto such a covering layer. On account of the electrical and thermal properties of silicon, this material is also suitable as a replacement substrate for a thin-film semiconductor chip.

The core layer preferably contains a metal or a metal compound. In general, at metal or a metal compound has a higher coefficient of thermal expansion than a semiconductor material. Consequently, in a composite substrate comprising a core layer containing a metal or a metal compound and a covering layer containing a semiconductor material, in total it is possible to obtain a coefficient of thermal expansion that is greater than the coefficient of thermal expansion of the first covering layer.

A metal from the group of transition metals, in particular a refractory metal, may be used for the core layer. By way of example, the core layer can contain zirconium, hafnium, vanadium, niobium, tantalum, chromium, molybdenum, tungsten, ruthenium, rhenium, osmium, iridium, titanium, iron, cobalt, scandium, yttrium, erbium, thulium, lutetium, terbium, dysprosium or holmium. These materials can first satisfy the requirements with regard to a high thermal stability of the eutectic compound. Second, these materials have relatively low vapor pressures, such that undesired dopings of the semiconductor layer sequence can be avoided.

The second covering layer advantageously has a coefficient of thermal expansion corresponding to the first covering layer. Flexure of the composite substrate can be prevented in this way. This is because if use were made of only the first covering layer and the core layer having different coefficients of thermal expansion, then this would be equivalent to a bimetal and would lead to the flexure of the composite substrate.

The second covering layer preferably contains a semiconductor material or a ceramic material. The second covering layer particularly preferably contains silicon, silicon carbide or aluminum nitride.

Preferably, the composite substrate, has a greater coefficient of thermal expansion than the covering layers. This is advantageous, in particular, if the first covering layer provided for the growth of the semiconductor layer sequence has a lower coefficient of thermal expansion than the semiconductor layer sequence. The composite substrate is then thermally better adapted to the semiconductor layer sequence overall than a growth substrate formed solely from the material of the first covering layer.

The composite substrate may have a lower coefficient of thermal expansion than the covering layers. This is advantageous, in particular, if the first covering layer provided for the growth of the semiconductor layer sequence has a greater coefficient of thermal expansion than the semiconductor layer sequence. The composite substrate is then thermally better adapted to the semiconductor layer sequence overall than a growth substrate formed solely from the material of the first covering layer.

The composite substrate is not fixed with regard to a specific number of covering layers or core layers. In particular, at least one further core layer and at least one further covering layer can be disposed downstream of the second covering layer on a side remote from the core layer.

Preferably, the optoelectronic semiconductor chip comprises a composite substrate in accordance with configurations mentioned above and also a semiconductor layer sequence which is arranged on the first covering layer of the composite substrate and has a greater coefficient of thermal expansion than the first covering layer.

Since the composite substrate preferably comprises a core layer whose coefficient of thermal expansion is greater than the coefficient of thermal expansion of the first covering layer, the composite substrate has in total a greater coefficient of thermal expansion than the first covering layer and is therefore thermally better adapted to the semiconductor layer sequence than a substrate formed solely from the material of the first covering layer if the semiconductor layer sequence has a greater coefficient of thermal expansion than the first covering layer.

However, if the semiconductor layer sequence has a lower coefficient of thermal expansion than the first covering layer, then use is advantageously made of a composite substrate having a lower coefficient of thermal expansion than the first covering layer. In particular, such an optoelectronic semiconductor chip comprises a composite substrate in accordance with configurations mentioned above and also a semiconductor layer sequence, which is arranged on the first covering layer of the composite substrate and has a lower coefficient of thermal expansion than the first covering layer.

Preferably, the coefficients of thermal expansion of semiconductor layer sequence and composite substrate differ to a lesser extent than the coefficients of thermal expansion of semiconductor layer sequence and first covering layer.

The semiconductor layer sequence can be grown on the first covering layer of the composite substrate. Alternatively, the semiconductor layer sequence can be grown on a growth substrate that differs from the composite substrate. The growth substrate used is preferably removed from the semiconductor layer sequence or at least greatly thinned. The semiconductor layer sequence is arranged as an alternative on the composite substrate. A semiconductor chip produced in this way is referred to as a thin-film semiconductor chip. A thin-film semiconductor chip is, to a good approximation, a Lambertian surface emitter and is therefore particularly well suited to application in a headlight.

The semiconductor layer sequence of the semiconductor chip preferably contains a nitride-based semiconductor material. This means that the semiconductor layer sequence or at least one layer thereof comprises, in particular, $Al_nGa_mIn_{1-n-m}N$, where $0 \leq n \leq 1$, $0 \leq m \leq 1$ and $n+m \leq 1$. In this case, this material need not necessarily have a mathematically exact composition according to the above formula. Rather, it can comprise one or a plurality of dopants and additional constituents which substantially do not change the characteristic physical properties of the $Al_nGa_mIn_{1-n-m}N$ material. For the sake of simplicity, however, the above formula only includes the essential constituents of the crystal lattice (Al, Ga, In, N), even if these can be replaced in part by small amounts of further substances.

Preferably, the optoelectronic semiconductor chip is a radiation-emitting semiconductor chip. To generate radiation, the semiconductor chip comprises an active zone with a pn junction. In the simplest case, the pn junction can be formed by a p-conducting and an n-conducting semiconductor layer which directly adjoin one another. Preferably, the actual radiation-generating structure, for instance in the form of a doped or undoped quantum structure, is formed between the p-conducting and the n-conducting layer. The quantum structure can be a single quantum well (SQW) structure or multiple quantum well (MQW) structure or else as a quantum wire or quantum dot structure. The active zone comprises a heterostructure in particular.

Further advantages and advantageous examples will become apparent from the following explanations in conjunction with FIGS. 1 to 8.

In the examples and figures identical or identically acting constituent parts are provided with the same reference symbols.

FIG. 1, shows a preferred example of a composite substrate 1. The composite substrate 1 comprises a first covering layer 2, a core layer 3 and a second covering layer 4. The core layer 3 is arranged between the two covering layers 2, 4. Preferably, the first covering layer contains a semiconductor material. Furthermore, the core layer 3 can have a greater coefficient of thermal expansion than the covering layers 2, 4. In particular, the covering layers 2, 4 contain silicon, while the core layer 3 contains a metal.

By way of example, the covering layers 2, 4 can be formed from silicon wafers. A metal sheet can be used for the core layer 3. In particular, metal sheets composed of tantalum or molybdenum constitute a cost-effective variant. Moreover, these materials form a stable compound with the silicon wafers.

To produce the composite substrate 1, the metal sheet is placed between the two silicon wafers and pressed together with the latter. The pressing is preferably effected at a pressure in the range of between 0.1 MPa and 1 MPa. Advantageous pressing times are between 1 s and 5 min at the final temperature. Furthermore, in particular, a temperature above the eutectic temperature prevails during pressing.

However, it is not necessary to attain the eutectic temperature with the associated melt formation to join the composite. Rather, diffusion processes and silicide formation can bring about the permanent connection sought even at lower temperatures. In this case, the joining temperature is preferably the highest growth temperature or bonding temperature which occurs during the growth or rebonding of the semiconductor layer sequence. As a result, it is possible to reduce the risk of damage to the silicon wafers due to the occurrence of tensile stresses. Furthermore, the joining pressures are preferably chosen to be higher than in the case of joining temperatures above the eutectic temperature. The joining pressures are, in particular, in the range of 1 MPa to 100 MPa. Furthermore, the joining times are preferably lengthened and are between 5 min and 500 min.

Preferably, the pressing process is carried out in an inert gas atmosphere composed of argon, nitrogen or some other noble gas. Prior to pressing, the atmospheric pressure can be lowered to below 20 mbar.

The surfaces of the silicon wafers and of the metal sheet are advantageously cleaned prior to pressing. In this case, the surfaces are freed of coatings, in particular of oxide layers.

The cleaning can be effected prior to the pressing of the composite by wet-chemical or dry-chemical methods. Silicon wafers and metal sheet can be treated jointly or separately.

Alternatively, the cleaning can take place during the joining process. By way of example, by adding hydrogen, it is possible to provide an atmosphere that promotes reduction of the surfaces. In this case, care should be taken to ensure that hydrogen embrittlement does not occur. Furthermore, the solubility of residual oxides in the silicon can be significantly increased, by choosing floating zone silicon instead of Czochralski silicon.

Figure 2:
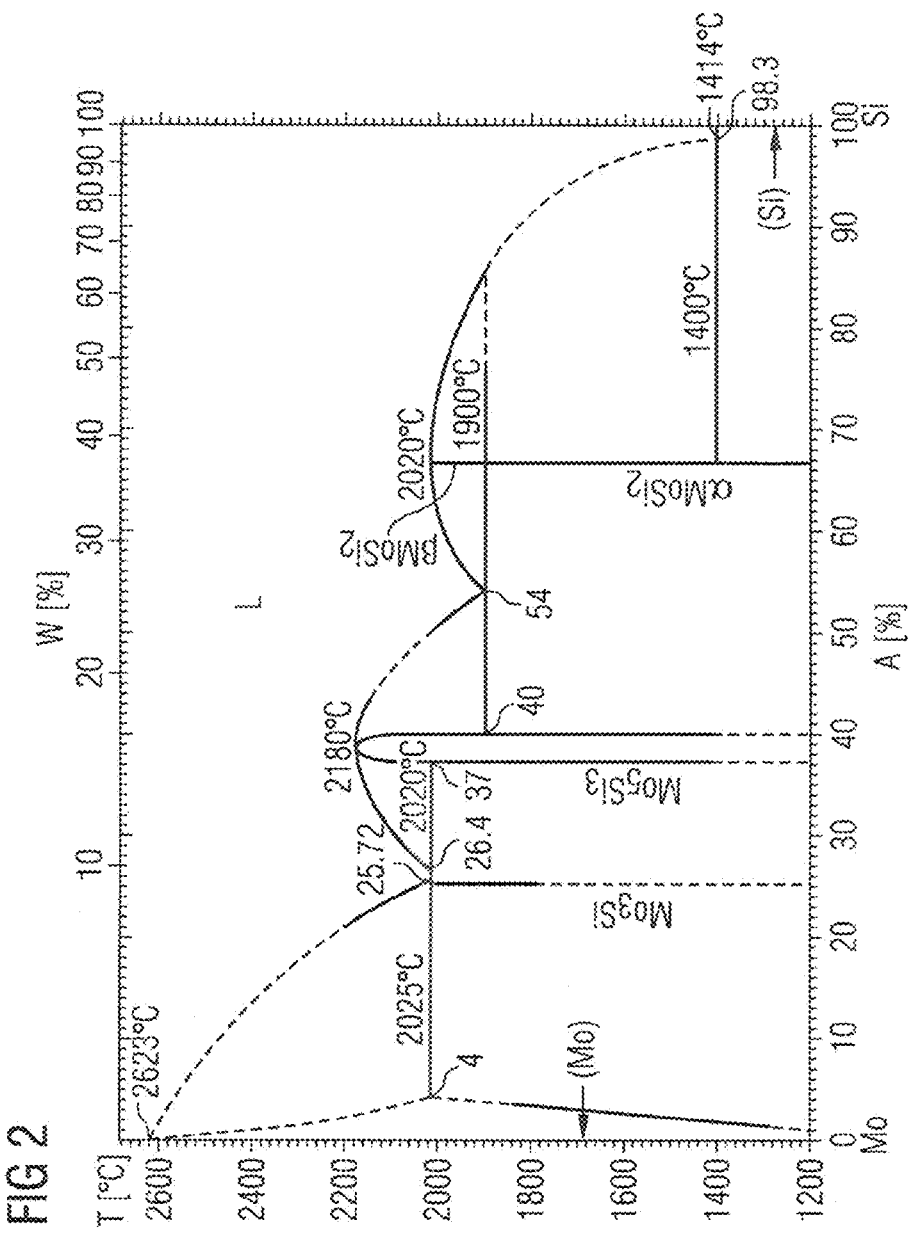
FIGS. 2 to 4 shows phase diagrams of different material systems.

The phase diagram illustrated in FIG. 2 shows the thermal behavior of the binary system Si-Mo. The temperature T [° C.] is plotted on the ordinate axis. The substance amount fraction A [%] of molybdenum and silicon in the binary system Si-Mo depending on the silicon fraction is plotted on the lower abscissa axis. The mass fraction W [%] of molybdenum and silicon in the binary system Si-Mo depending on the silicon fraction is plotted on the upper abscissa axis.

In the region identified by L, the compound is liquid. A solid eutectic compound can be obtained if the silicon is heated to 1400° C. (cf. A=98.3%). In this case, solid $MoSi_2$ forms under pressure. Advantageously, this compound having a eutectic temperature of 1400° C. is stable relative to customary growth and bonding temperatures.

Figure 3:
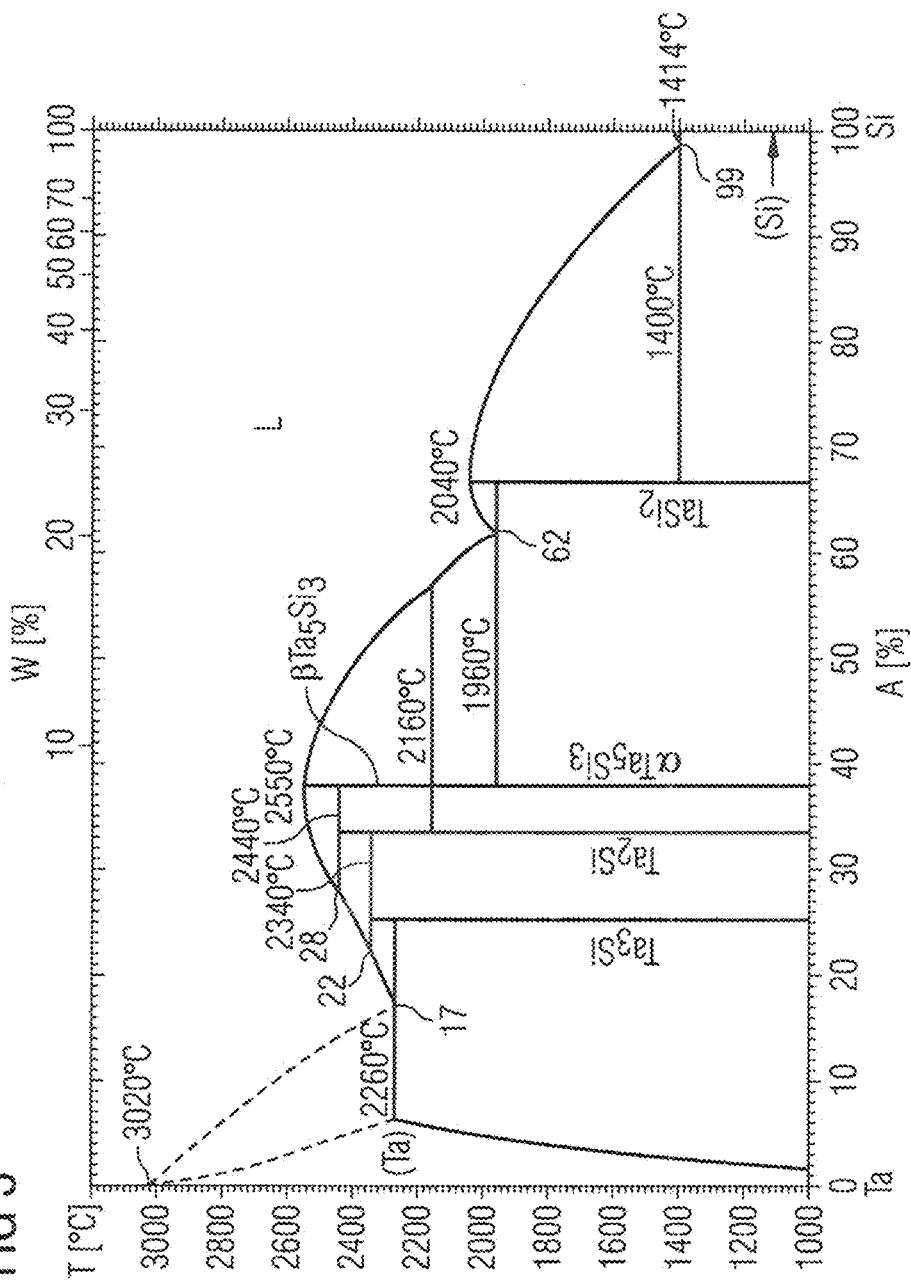

A thermal behavior similar to that of the binary system Si-Mo explained in connection with FIG. 2 is exhibited by the binary system Si-Ta (cf. FIG. 3). In this case, too, a solid eutectic compound can be obtained if the silicon is heated to 1400° C. (cf. A=99%). Solid $TaSi_2$ forms under pressure. The compound has a eutectic temperature of 1400° C.

Both in the case of Si-Mo and in the case of Si-Ta, the risk of contamination by the respective metal is relatively low. This is because the vapor pressure of Mo is only $10^{-8}$ torr at 1592° C. and the vapor pressure of Ta is likewise only $10^{-8}$ torr at 1957° C.

Figure 4:
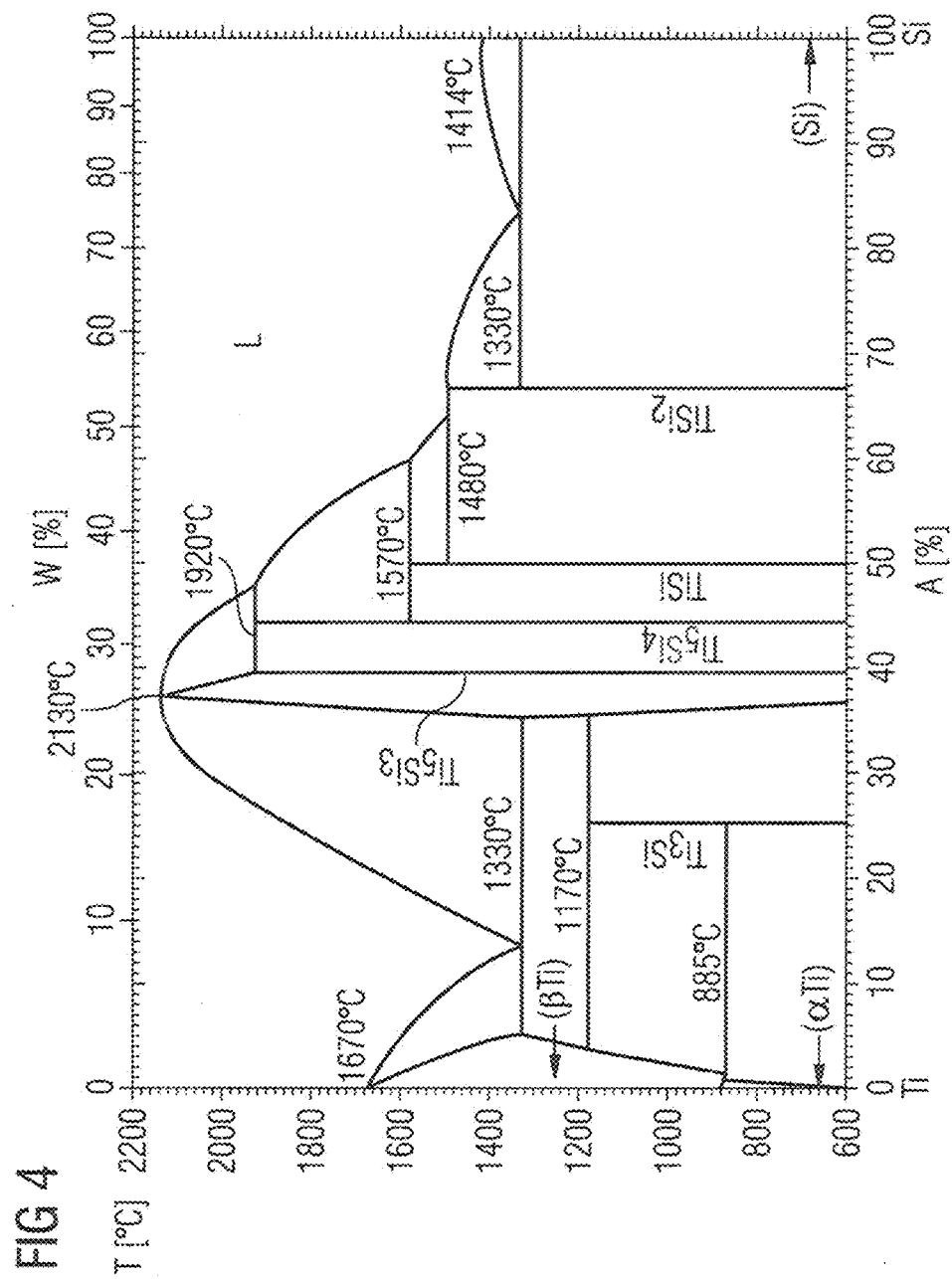

The situation is different in the case of the binary system Si-Ti illustrated in FIG. 4. In this case, although the silicon only has to be heated to 1330° C. to form solid $TiSi_2$, the vapor pressure is $10^{-6}$ torr even at 1227° C. Consequently, the risk of contamination in the case of this binary system is greater than in the case of Si-Mo or Si-Ta.

To summarize, it can be stated that the binary systems Si-Mo, Si-Ta and Si-Ti are suitable for use in our composite substrate account of their high eutectic temperatures lying above the customary growth and bonding temperatures. The composite substrate can correspondingly comprise a first and second covering layer composed of silicon and a core layer composed of molybdenum, tantalum or titanium.

Figure 5:
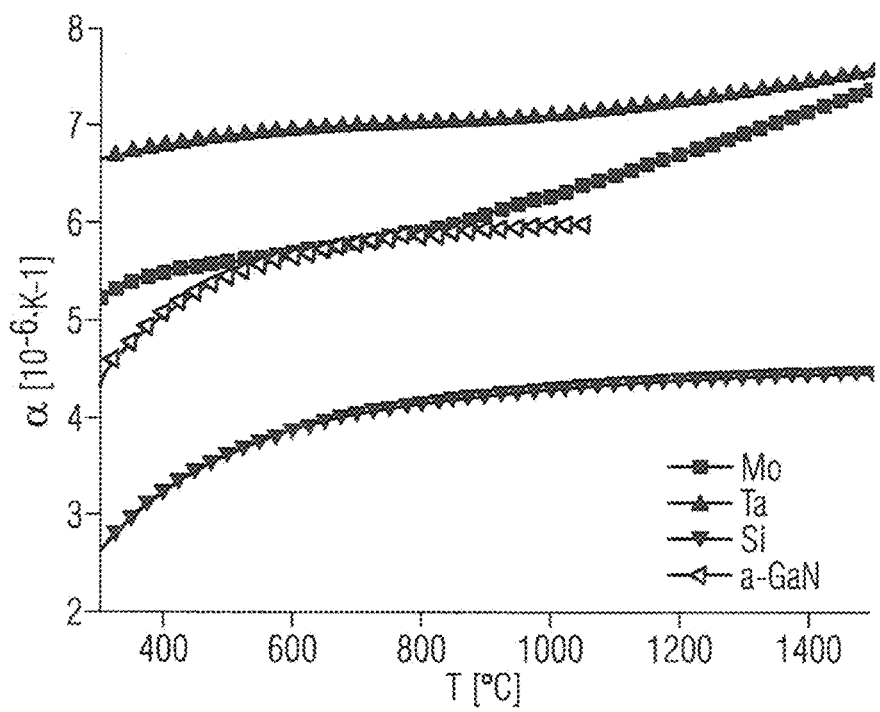
FIGS. 5 to 7 are graphs illustrating the temperature dependence of the coefficient of thermal expansion of different material systems.

The graph in FIG. 5 presents the temperature dependence of the coefficient of thermal expansion $\alpha$ [$10^{-6}$/K] for the materials GaN, Si, Ta and Mo. In the illustrated temperature range 300° C.≤T≤1500° C., GaN has a significantly higher coefficient of thermal expansion a than Si, Ta in turn has a significantly higher coefficient of thermal expansion $\alpha$ than GaN. By contrast the coefficient of thermal expansion $\alpha$ of Mo approximates to the coefficient of thermal expansion $\alpha$ of GaN at least in regions, that as to say that the expansion behavior of Mo is more similar to the expansion behavior of GaN than the expansion behavior of Ta.

Figure 6:
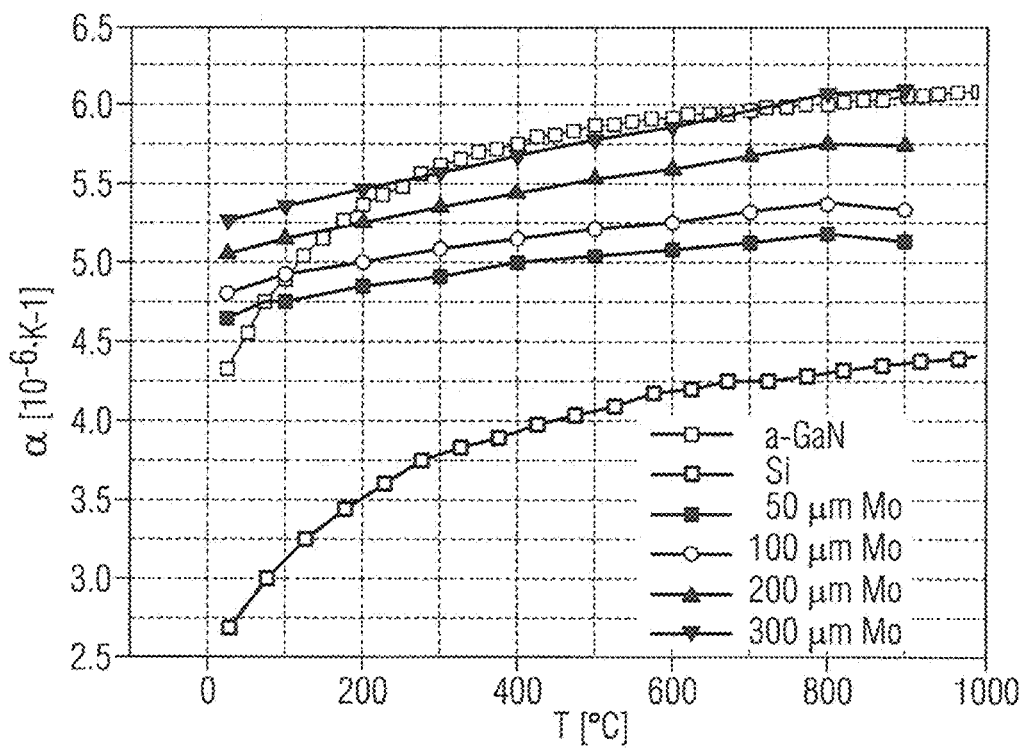
Figure 7:
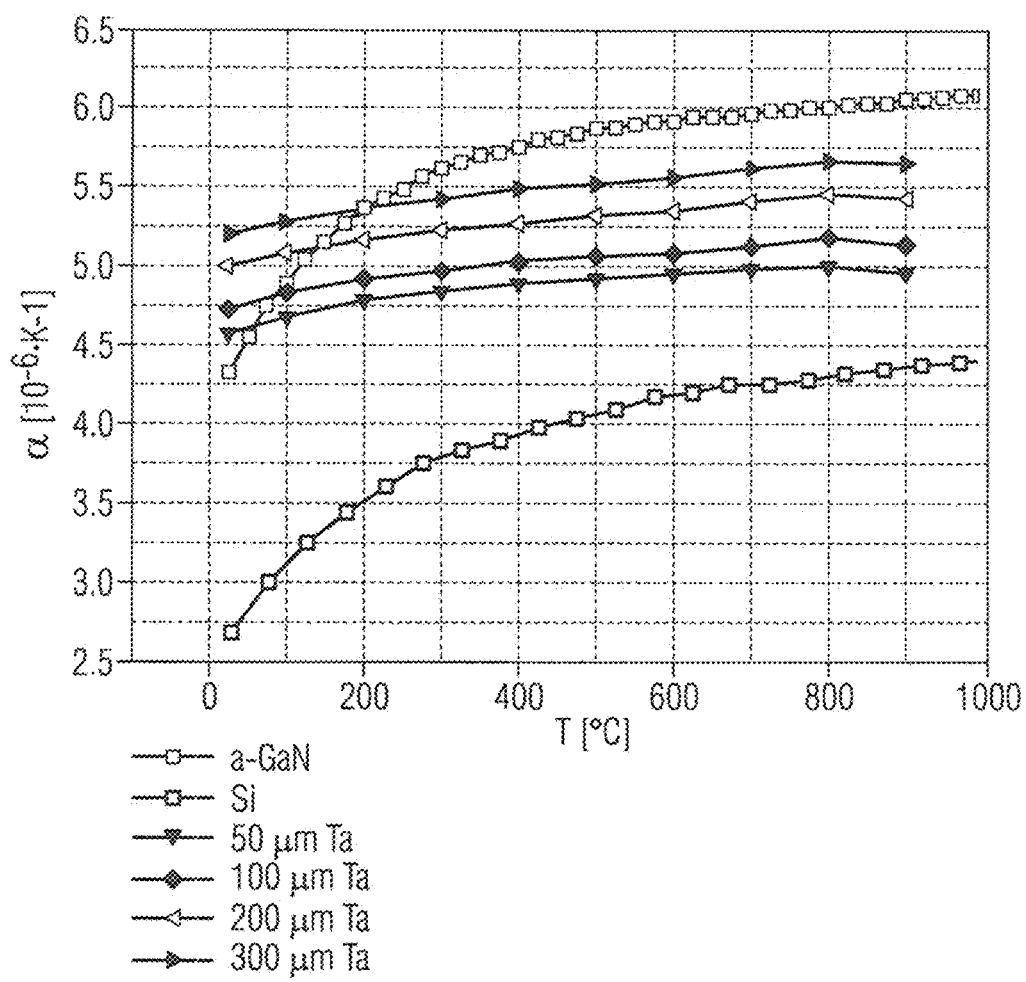
Figure 8:
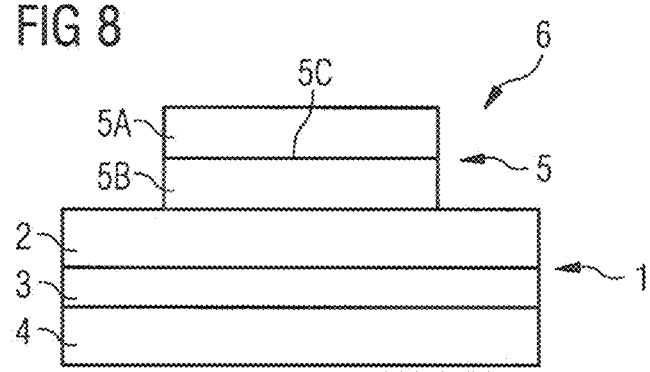
FIG. 8 shows a schematic cross section of an optoelectronic semiconductor chip.

This insight is reflected in the graphs in FIGS. 6 to 8. These graphs illustrate the coefficients of thermal expansion $\alpha$ for various composite substrates, the illustrated curves being results of simulations.

In the case of FIG. 6, the composite substrate is formed from a first and second covering layer composed of Si, each having a thickness of 500 μm. The core-layer contains Mo, wherein the thickness is 50 μm, 100 μm, 200 μm or 300 μm. Depending on the thickness of the core layer, different coefficients of thermal expansion $\alpha$ arise for the composite substrate. It generally holds true that the coefficient of thermal expansion $\alpha$ increases as me temperature T rises. Furthermore, it can be discerned in FIG. 6 that at higher temperatures the coefficient of thermal expansion α of the composite substrate approximates more and more to the coefficient of thermal expansion α of GaN as the thickness of the core layer increases. This can be explained by the fact that the expansion behavior of the composite substrate, with increasing thickness of the core layer, is determined more and more by the core layer and less by the covering layers. Since the thermal behavior of Mo is relatively close to the thermal behavior of GaN, as already explained in conjunction with the graph in FIG. 5, a thermal behavior that is relatively close to the thermal behavior of GaN can also be obtained in the case of a composite substrate comprising a core layer Composed of Mo.

In comparison with a composite substrate comprising a core layer composed of Mo, the thermal behavior of a composite substrate comprising a core layer composed of Ta differs from the thermal behavior of GaN to a greater extent (cf. FIG. 7). The composite substrate on which FIG. 7 is based comprises a first and second covering layer composed of Si, each having a thickness of 500 μm, and a core layer composed of Ta, the thickness of which is 50 μm, 100 μm, 200 μm or 300 μm. In FIG. 7, too, it can be discerned that at higher temperatures the coefficient of thermal expansion α of the composite substrate approximates to the coefficient of thermal expansion α of GaN more and more as the thickness of the core layer increases, which can be explained by the fact that the expansion behavior of the composite substrate, with an increasing thickness of the core layer, is determined more and more by the core layer and less by the covering layers.

FIG. 8 shows an optoelectronic semiconductor chip 6 comprising a composite substrate 1 as illustrated in FIG. 1 and a semiconductor layer sequence 5, which is arranged on the first covering layer 2 of the composite substrate 1. The semiconductor layer sequence 5 can be grown onto the first covering layer 2 or as an alternative be applied to the first covering layer 2 of the composite substrate 1 in a thin-film process.

The semiconductor layer sequence 5 comprises a region 5A of a first conductivity type and a region 5B of a second conductivity type, wherein an active zone 5C is formed between the two regions 5A, 5B. Radiation is preferably generated in the active zone 5C. The semiconductor layer sequence 5 advantageously contains a nitride-based semiconductor material.

The composite substrate 1 advantageously has a coefficient of thermal expansion which is better adapted to the coefficient of thermal expansion of the semiconductor layer sequence 5 than would be the case for a substrate formed solely from the material of the first covering layer 2.

On account of the improved expansion behavior of the composite substrate 1, a more homogeneous crystal quality of the semiconductor layer sequence 5 can be obtained. Furthermore, the risk of cracking in the semiconductor layer sequence 5 can be reduced. Consequently, a buffer structure can be dispensed with, which in turn has a positive effect on the vertical and lateral current conductivity in the semiconductor chip 6.

This disclosure is not restricted by the description on the basis of the examples. Rather, the disclosure encompasses any novel feature and also any combination of features, which in particular includes any combination of features in the appended claims, even if the features or the combination itself is not explicitly specified in the claims or examples.

The invention claimed is:

1. A composite substrate for a semiconductor chip comprising:
   a first covering layer containing a semiconductor material,
   a second covering layer, and
   a core layer comprising a metal or a metal compound arranged between the first covering layer and the second covering layer having a greater coefficient of thermal expansion than the first and second covering layers,
   wherein the first and second covering layers and the core layer are held together by a eutectic compound.

2. The composite substrate according to claim 1, wherein the second covering layer contains a semiconductor material or a ceramic material.

3. The composite substrate according to claim 1, wherein the second covering layer contains Si, SiC or AlN.

4. The composite substrate according to claim 1, further comprising at least one further core layer and at least one further covering layer disposed downstream of the second covering layer on a side remote from the core layer.

5. The composite substrate according to claim 1, wherein the eutectic compound has a eutectic temperature that is greater than 1100° C.

6. The composite substrate according to claim 1, wherein the first covering layer contains silicon.

7. The composite substrate according to claim 1, wherein the core layer contains at least one material selected from the group consisting of zirconium, hafnium, vanadium, niobium, tantalum, chromium, molybdenum, tungsten, ruthenium, rhenium, osmium, iridium, titanium, iron, cobalt, scandium, yttrium, erbium, thulium, lutetium, terbium, dysprosium and holmium.

8. A composite substrate for a semiconductor chip comprising:
   a first covering layer containing a semiconductor material,
   a second covering layer, and
   a core layer arranged between the first covering layer and the second covering layer,
   wherein the core layer has a lower coefficient of thermal expansion than the first and second covering layers.

9. An optoelectronic semiconductor chip comprising:
   a composite substrate according to claim 8, and
   a semiconductor layer sequence arranged on the first covering layer and having a lower coefficient of thermal expansion than the first covering layer.

10. The optoelectronic semiconductor chip according to claim 9, wherein the coefficients of thermal expansion of semiconductor layer sequence and composite substrate differ to a lesser extent than the coefficients of thermal expansion of semiconductor layer sequence and first covering layer.

11. The composite substrate according to claim 8, wherein the second covering layer contains a semiconductor material or a ceramic material.

12. The composite substrate according to claim 8, wherein the second covering layer contains Si, SiC or AlN.

13. The composite substrate according to claim 8, further comprising at least one further core layer and at least one further covering layer disposed downstream of the second covering layer on a side remote from the core layer.

14. The composite substrate according to claim 8, wherein the covering layers and the core layer are held together by a eutectic compound.

15. The composite substrate according to claim 14, wherein the eutectic compound has a eutectic temperature that is greater than 1100°C.

16. The composite substrate according to claim 8, wherein the core layer contains a metal or a metal compound.

17. An optoelectronic semiconductor chip comprising:
   a composite substrate comprising:
      a first covering layer containing a semiconductor material,
      a second covering layer, and a core layer arranged between the first covering layer and the second covering layer and having a greater coefficient of thermal expansion than the first and second covering layers, and a semiconductor layer sequence arranged on the first covering layer and having a greater coefficient of thermal expansion than the first covering layer.

18. The optoelectronic semiconductor chip according to claim 17, wherein the coefficients of thermal expansion of semiconductor layer sequence and composite substrate differ to a lesser extent than the coefficients of thermal expansion of semiconductor layer sequence and first covering layer.

* * * * *